United States Patent
Ye (10) Patent No.: US 8,435,843 B2
(45) Date of Patent: *May 7, 2013

(54) TREATMENT OF GATE DIELECTRIC FOR MAKING HIGH PERFORMANCE METAL OXIDE AND METAL OXYNITRIDE THIN FILM TRANSISTORS

(75) Inventor: Yan Ye, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/355,316

(22) Filed: Jan. 20, 2012

(65) Prior Publication Data

US 2012/0112186 A1    May 10, 2012

Related U.S. Application Data

(63) Continuation of application No. 12/493,699, filed on Jun. 29, 2009, now Pat. No. 8,101,949.

(60) Provisional application No. 61/077,831, filed on Jul. 2, 2008, provisional application No. 61/117,744, filed on Nov. 25, 2008, provisional application No. 61/117,747, filed on Nov. 25, 2008.

(51) Int. Cl.
  *H01L 21/336* (2006.01)
(52) U.S. Cl.
  USPC .................................................. 438/158
(58) Field of Classification Search ........... 257/59, 257/72, 359, 40, 43, E29.296; 438/104, 158
See application file for complete search history.

(56) References Cited

U.S. PATENT DOCUMENTS 4,436,770 A   3/1984 Nishizawa et al.
4,695,432 A   9/1987 Colin et al.
(Continued)

FOREIGN PATENT DOCUMENTS

CN   1588623 A   3/2005
CN   1700428 A   11/2005
(Continued)

OTHER PUBLICATIONS

Zong et al., "Optical band gap of zinc nitride films prepared on quartz substrates from a zinc nitride target by reactive rf magnetron sputtering", Applied Surface Science 252 (2006), pp. 7983-7986.

(Continued)

*Primary Examiner* — Nathan Ha
(74) *Attorney, Agent, or Firm* — Patterson & Sheridan, L.L.P.

(57) ABSTRACT

Embodiments of the present invention generally include TFTs and methods for their manufacture. The gate dielectric layer in the TFT may affect the threshold voltage of the TFT. By treating the gate dielectric layer prior to depositing the active channel material, the threshold voltage may be improved. One method of treating the gate dielectric involves exposing the gate dielectric layer to $N_2O$ gas. Another method of treating the gate dielectric involves exposing the gate dielectric layer to $N_2O$ plasma. Silicon oxide, while not practical as a gate dielectric for silicon based TFTs, may also improve the threshold voltage when used in metal oxide TFTs. By treating the gate dielectric and/or using silicon oxide, the threshold voltage of TFTs may be improved.

20 Claims, 6 Drawing Sheets

U.S. PATENT DOCUMENTS

| | | |
|---|---|---|
| 4,769,291 A | 9/1988 | Belkind et al. |
| 4,816,082 A | 3/1989 | Guha et al. |
| 4,983,360 A | 1/1991 | Merdrignac et al. |
| 5,279,679 A | 1/1994 | Murakami et al. |
| 5,346,601 A | 9/1994 | Barada et al. |
| 5,352,300 A | 10/1994 | Niwa et al. |
| 5,420,452 A | 5/1995 | Tran et al. |
| 5,522,934 A | 6/1996 | Suzuki et al. |
| 5,571,749 A | 11/1996 | Matsuda et al. |
| 5,620,523 A | 4/1997 | Maeda et al. |
| 5,625,199 A | 4/1997 | Baumbach et al. |
| 5,668,663 A | 9/1997 | Varaprasad et al. |
| 5,683,537 A | 11/1997 | Ishii |
| 5,700,699 A | 12/1997 | Han et al. |
| 5,716,480 A | 2/1998 | Matsuyama et al. |
| 5,720,826 A | 2/1998 | Hayashi et al. |
| 5,731,856 A | 3/1998 | Kim et al. |
| 5,993,594 A | 11/1999 | Wicker et al. |
| 6,150,668 A | 11/2000 | Bao et al. |
| 6,153,013 A | 11/2000 | Sakai et al. |
| 6,153,893 A | 11/2000 | Inoue et al. |
| 6,159,763 A | 12/2000 | Sakai et al. |
| 6,180,870 B1 | 1/2001 | Sano et al. |
| 6,228,236 B1 | 5/2001 | Rosenstein et al. |
| 6,238,527 B1 | 5/2001 | Sone et al. |
| 6,329,269 B1 | 12/2001 | Hamada et al. |
| 6,388,301 B1 | 5/2002 | Tawada et al. |
| 6,458,673 B1 | 10/2002 | Cheung |
| 6,488,824 B1 | 12/2002 | Hollars et al. |
| 6,566,180 B2 | 5/2003 | Park et al. |
| 6,620,719 B1 | 9/2003 | Andry et al. |
| 6,700,057 B2 | 3/2004 | Yasuno |
| 6,746,959 B2 | 6/2004 | Lyu |
| 6,787,010 B2 | 9/2004 | Cuomo et al. |
| 6,825,134 B2 | 11/2004 | Law et al. |
| 6,881,305 B2 | 4/2005 | Black et al. |
| 6,890,803 B2 | 5/2005 | Lin et al. |
| 6,943,359 B2 | 9/2005 | Vardeny et al. |
| 6,953,947 B2 | 10/2005 | Son et al. |
| 7,026,713 B2 | 4/2006 | Hoffman et al. |
| 7,037,157 B2 | 5/2006 | Murakami et al. |
| 7,145,174 B2 | 12/2006 | Chiang et al. |
| 7,158,208 B2 | 1/2007 | De Jager et al. |
| 7,189,992 B2 | 3/2007 | Wager, III et al. |
| 7,235,810 B1 | 6/2007 | Yamazaki et al. |
| 7,297,977 B2 | 11/2007 | Hoffman et al. |
| 7,309,895 B2 | 12/2007 | Hoffman et al. |
| 7,339,187 B2 | 3/2008 | Wager, III et al. |
| 7,378,286 B2 | 5/2008 | Hsu et al. |
| 7,382,421 B2 | 6/2008 | Hoffman et al. |
| 7,601,984 B2 | 10/2009 | Sano et al. |
| 7,626,201 B2 | 12/2009 | Chiang et al. |
| 7,629,191 B2 | 12/2009 | Chiang et al. |
| 7,674,650 B2 | 3/2010 | Akimoto et al. |
| 7,750,440 B2 | 7/2010 | Yagi |
| 7,879,698 B2 | 2/2011 | Ye |
| 7,927,713 B2 | 4/2011 | Ye |
| 8,012,794 B2 | 9/2011 | Ye |
| 8,101,949 B2 | 1/2012 | Ye |
| 2002/0117719 A1 | 8/2002 | Ando et al. |
| 2002/0149053 A1 | 10/2002 | Tsunoda et al. |
| 2003/0015234 A1 | 1/2003 | Yasuno |
| 2003/0047785 A1 | 3/2003 | Kawasaki et al. |
| 2003/0049464 A1 | 3/2003 | Glenn et al. |
| 2003/0207093 A1 | 11/2003 | Tsuji et al. |
| 2004/0018797 A1 | 1/2004 | Murakami et al. |
| 2004/0092061 A1 | 5/2004 | Kawasaki et al. |
| 2004/0113098 A1 | 6/2004 | Vardeny et al. |
| 2004/0164294 A1 | 8/2004 | Son et al. |
| 2004/0175511 A1 | 9/2004 | Hartig |
| 2004/0235224 A1 | 11/2004 | Lin et al. |
| 2005/0017244 A1 | 1/2005 | Hoffman et al. |
| 2005/0028860 A1 | 2/2005 | Sano et al. |
| 2005/0062057 A1 | 3/2005 | Yamazaki et al. |
| 2005/0062409 A1 | 3/2005 | Yamazaki et al. |
| 2005/0067953 A1 | 3/2005 | Yamazaki et al. |
| 2005/0181532 A1 | 8/2005 | Patel et al. |
| 2005/0181534 A1 | 8/2005 | Yoshimi et al. |
| 2005/0233092 A1 | 10/2005 | Choi et al. |
| 2005/0233595 A1 | 10/2005 | Choi et al. |
| 2005/0251990 A1 | 11/2005 | Choi et al. |
| 2006/0011139 A1 | 1/2006 | Sterling et al. |
| 2006/0033106 A1 | 2/2006 | Seo et al. |
| 2006/0038182 A1 | 2/2006 | Rogers et al. |
| 2006/0043447 A1 | 3/2006 | Ishii et al. |
| 2006/0046476 A1 | 3/2006 | Nakamura et al. |
| 2006/0065299 A1 | 3/2006 | Fukawa et al. |
| 2006/0108636 A1 | 5/2006 | Sano et al. |
| 2006/0125098 A1 | 6/2006 | Hoffman et al. |
| 2006/0258064 A1 | 11/2006 | Chen et al. |
| 2006/0286725 A1 | 12/2006 | Cheng et al. |
| 2007/0007125 A1 | 1/2007 | Krasnov et al. |
| 2007/0026321 A1* | 2/2007 | Kumar ............... 430/5 |
| 2007/0029626 A1 | 2/2007 | Sakama et al. |
| 2007/0030569 A1 | 2/2007 | Lu et al. |
| 2007/0057261 A1 | 3/2007 | Jeong et al. |
| 2007/0065962 A1 | 3/2007 | Pichler |
| 2007/0068571 A1 | 3/2007 | Li et al. |
| 2007/0093013 A1 | 4/2007 | Chua et al. |
| 2007/0141784 A1 | 6/2007 | Wager et al. |
| 2007/0194379 A1 | 8/2007 | Hosono et al. |
| 2007/0252129 A1 | 11/2007 | Yagi |
| 2007/0252147 A1 | 11/2007 | Kim et al. |
| 2007/0252152 A1* | 11/2007 | Sato et al. .......... 257/71 |
| 2008/0073656 A1* | 3/2008 | Peng et al. .......... 257/79 |
| 2008/0108198 A1 | 5/2008 | Wager et al. |
| 2008/0132009 A1 | 6/2008 | Hirai |
| 2008/0173870 A1 | 7/2008 | Kim et al. |
| 2008/0224133 A1 | 9/2008 | Park et al. |
| 2008/0264777 A1 | 10/2008 | Ye |
| 2008/0272388 A1 | 11/2008 | Ushiyama et al. |
| 2008/0308411 A1 | 12/2008 | Guo et al. |
| 2009/0023959 A1 | 1/2009 | D'Amore et al. |
| 2009/0026065 A1 | 1/2009 | Nukeaw et al. |
| 2009/0045398 A1 | 2/2009 | Kato et al. |
| 2009/0050884 A1 | 2/2009 | Ye |
| 2009/0212287 A1* | 8/2009 | Nathan et al. .......... 257/57 |
| 2009/0233424 A1 | 9/2009 | Ye |
| 2009/0236597 A1 | 9/2009 | Ye |
| 2009/0239335 A1 | 9/2009 | Akimoto et al. |
| 2009/0239359 A1* | 9/2009 | Ye .................. 438/479 |
| 2009/0305461 A1 | 12/2009 | Akimoto et al. |
| 2010/0001274 A1 | 1/2010 | Ye |
| 2010/0078633 A1 | 4/2010 | Watanabe |
| 2010/0090215 A1 | 4/2010 | Lee |
| 2010/0109002 A1 | 5/2010 | Itagaki et al. |
| 2010/0117073 A1 | 5/2010 | Yamazaki et al. |
| 2010/0120197 A1 | 5/2010 | Levy et al. |
| 2010/0140611 A1 | 6/2010 | Itagaki et al. |
| 2010/0193783 A1 | 8/2010 | Yamazaki et al. |
| 2010/0252832 A1 | 10/2010 | Asano et al. |

FOREIGN PATENT DOCUMENTS

| | | |
|---|---|---|
| CN | 1881549 A | 12/2006 |
| EP | 145403 A2 | 6/1985 |
| JP | 02-240637 A | 9/1990 |
| JP | 06-045354 A | 2/1994 |
| JP | 3255942 B2 | 2/2002 |
| JP | 3958605 | 5/2007 |
| KR | 1999009046 | 3/1999 |
| KR | 2001-0011855 A | 2/2001 |
| KR | 2001051193 | 6/2001 |
| KR | 10-0590925 B1 | 6/2006 |
| WO | WO-2008/133345 A1 | 11/2008 |
| WO | WO-2010/002803 | 1/2010 |

OTHER PUBLICATIONS

Tu et al., "Nitrogen-doped p-type ZnO films prepared from nitrogen gas radio-frequency magnetron sputtering", Journal of Applied Physics 100, 053705 (2006).

Futushara et al., "Optical properties of zinc oxynitride thin films", Thin Film Solids, 317 (1998), pp. 322-325.

Ozgur, et al. "A comprehensive review of ZnO materials and devices," Journal of Applied Physics 98, 041301 (2005), American Institute of Physics.

Wang, et al. "Epitaxial growth of NH3-doped ZnO thin films on <0224> oriented sapphire substrates," Journal of Crystal Growth 255, Apr. 9, 2003, pp. 293-297.

Ye, et al. "Preparation and characteristics of p-type ZnO films by DC reactive magnetron sputtering," Journal of Crystal Growth 253, Feb. 4, 2003, pp. 258-264.

Korean Office Action dated Jul. 21, 2008 for Korean Application No. 10-2007-0066962.

Hiramatsu, et al. "Formation of TiN films with low Cl concentration by pulsed plasma chemical vapor deposition," American Vacuum Society, vol. 14, No. 3, May/Jun. 1996, pp. 1037-1040.

Son et al., "Threshold Voltage Control of Amorphous Gallium Indium Zinc Oxide TFTs by Suppressing Back-Channel Current" Electrochemical and Solid-State Letters, 12 (1) H26-H28 (2009).

Fortunato, et al. "Fully transparent ZnO thin-film transistor produced at room temperature," Advanced Materials, 2005, 17, No. 5, Mar. 6, 2005, Wiley-VCH verlag Gbmh & Co. KGaA, Weinheim, pp. 590-594.

Hiramatsu et al. "4.1: Distinguished Paper: High Mobility Top-Gate Zinc Oxide Thin-Film Transistors (ZnO-TFTs) for Active-Matrix Liquid Crystal Displays," SID 06 Digest ISSN0006-0966X/06/3701-0018-$1.00+.00, 2006, pp. 18-20.

Li et al. "Progress in semiconducting oxide-based thin-film transistors for displays," Institute of Physics, Semicon. Sci. Technol. 20 (2005), pp. 720-725.

Masuda et al. "Transparent thin film transistors using ZnO as an active channel layer and their electrical properties," Journal of Applied Physics, vol. 93, No. 3, Feb. 1, 2003, American Institute of Physics, pp. 1624-1630.

International Search Report and Written Opinion dated Aug. 8, 2008 for International Application No. PCT/US08/59638.

International Search Report and Written Opinion dated Oct. 8, 2008 for International Application No. PCT/US08/71890.

International Search Report and Written Opinion dated Oct. 15, 2007 for International Application No. PCT/US07/66166.

Toyoura et al., "Optical properties of zinc nitride formed by molten salt electrochemical process", Thin Film Solids 492 (2005), pp. 88-92.

Ma et al., "Method of control of nitrogen content in ZnO films: Structural and photoluminescence properties", J. Vac. Sci. Technol. B 22(1), Jan./Feb. 2004, pp. 94-98.

Fortunato et al., "Wide-bandgap high-mobility ZnO thin-film transistors produced at room temperature", Applied Physics Letters, vol. 85, No. 13, Sep. 27, 2004, pp. 2541-2543.

Hoffman et al., "ZnO-based transparent thin-film transistors", Applied Physics Letters, vol. 82, No. 5, Feb. 3, 2003, pp. 733-735.

Bain et al., "Deposition and electrical properties of N—In codoped p-type ZnO films by ultrasonic spray pyrolysis", Applied Physics Letters, vol. 84, No. 4, Jan. 26, 2004, pp. 541-543.

Barnes et al., "On the formation and stability of p-type conductivity in nitrogen-doped zinc oxide", Applied Physics Letters, 86, 112112 (2005).

Hirao et al., "4.1: Distinguished Paper: High Mobility Top-Gate Zinc Oxide Thin-Film Transistors (ZnO-TFTs) for Active-Matrix Liquid Crystal Displays", SID 06 Digest (2006), pp. 18-20.

Hosano et al., "Working hypothesis to explore novel wide band gap electrically conducting amorphous oxides and examples", Journal of Non-Crystalline Solids, 198-200 (1996) pp. 165-169.

Park et al., "Highly Stable $Ga_2O_3$-$In_2O_3$-$ZnO$ Thin-Film Transistors for AM-OLED Application", IDW '07, pp. 1775-1778.

Kwon et al., "4 inch QVGA AMOLED display driven by GaInZnO TFT", IDW '07, pp. 1783-1786.

Perkins et al., "Identification of nitrogen chemical states in N-doped ZnO via x-ray photoelectron spectroscopy", Journal of Applied Physics 97, 034907 (2005).

Yao et al., "Effects of nitrogen doping and illumination on lattice constants and conductivity behavior of zinc oxide grown by magnetron sputtering", Journal of Applied Physics 99, 123510 (2006).

Klaitabtim et al., "Growth and Characterization of Zinc Oxynitride Thin Films by Reactive Gas-Timing RF Magnetron Sputtering", Japanese Journal of Applied Physics, vol. 47, No. 1, 2008, pp. 653-656.

Lee et al., "42.2: World's Largest (15-inch) XGA AMLCD Panel Using IGZO Oxide TFT", SID 08 Digest, pp. 625-628.

Zong et al., "Structural properties of zinc nitride empty balls", Materials Letters 60 (2006), pp. 905-908.

Nomura et al., "Room-temperature fabrication of transparent flexible thin-film transistors using amorphous oxide semiconductors", Nature, vol. 432, Nov. 25, 2004, pp. 788-492.

Minami, Tadatsugu, "New n-Type Transparent Conducting Oxides", MRS Bulletin, Aug. 2000.

Zong et al., "Synthesis and thermal stability of $Zn_3N_2$ powder", Solid State Communications 132 (2004), pp. 521-525.

Kaminska et al., "Transparent p-type ZnO films obtained by oxidation of sputter-deposited $Zn_3N_2$", Solid State Communications, 135 (2005), pp. 11-15.

Son et al., "42.4L: Late-News Paper: 4 inch QVGA AMOLED Driven by the Threshold Voltage Controlled Amorphous GIZO ($Ga_2O_3$-$In_2O_3$-$ZnO$) TFT", SID 08 Digest, pp. 633-636.

Futushara et al., "Structural, electrical and optical properties of zinc nitride thin films prepared by reactive rf magnetron sputtering", Thin Film Solids, 322 (1998), pp. 274-281.

Carcia et al., "Transparent ZnO thin-film transistor fabricated by rf magnetron sputtering", Applied Physics Letters, col. 82, No. 7, Feb. 17, 2003, pp. 1117-1119.

Yan et al., "Control of Doping by Impurity Chemical Potentials: Predictions for p-type ZnO", Physical Review Letters, vol. 86, No. 25, Jun. 18, 2001, pp. 5723-5726.

Ohya et al., "Thin Film Transistor of ZnO Fabricated by Chemical Solution Deposition", Jpn. J. Appl. Phys., vol. 40 (2001), pp. 297-298.

Hossain, et al., "Modeling and simulation of polycrystalline ZnO thin-film transistors", Journal of Applied Physics, vol. 94, No. 12, Dec. 15, 2003, pp. 7768-7777.

Park et al., "Challenge to Future Displays: Transparent AM-OLED driven by PEALD grown ZnO TFT", IMID '07 Digest, pp. 1249-1252.

Hirao et al., "Bottom-Gate Zinc Oxide Thin-Film Transistors (ZnO TFTs) for AM-LCDs", IEEE Transactions on Electron Devices, col. 55, No. 11, Nov. 2008, pp. 3136-3142.

First Office Action for Chinese Patent Application No. 200880015621.X dated Nov. 24, 2010.

Wang et al., "Fabrication and characteristics of the low-resistive p-type ZnO thin films by DC reactive magnetron sputtering", Materials Letters, vol. 60, p. 912-914, Dec. 31, 2006.

Wang, "The optical and electrical characteristics and the microstructure of Al doped zinc oxide thin films", Dept. of Information material science and engineering Guilin, vol. 25(02), p. 19-22, Apr. 20, 2005.

Li, "The growth of high quality ZnO thin films at low temperature by PECVD & study of its properties", Chinese doctoral dissertations & master's theses full-text database (doctor) basic sciences, Journal 2nd, A005-11, Dec. 15, 2002.

Search report and written opinion for PCT/US2009/047966 dated Dec. 27, 2010.

Search report and written opinion for PCT/US2009/049092 dated Dec. 27, 2010.

European search report dated Jun. 30, 2010 for European Patent Application 08797025.7.

Barnes et al., "A comparison of plasma-activated N2/O2 and N2)/O2 mixtures for use in ZnO:N synthesis by chemical vapor deposition", Journal of Applied Physics, vol. 96, No. 12 (Dec. 2004).

Cao et al., "Low resistivity p-ZnO films fabricated by sol-gel spin coating", Applied Physics Letters, 88, 251116 (Jun. 2006).

Zhao et al., "Growth of nitrogen-doped p-type ZnO films by spray pyrolysis and their electrical and optical properties", Journal of Crystal Growth, 280 (May 2005), pp. 495-501.

Barnes et al., "A comparison of plasma-activated N2/O2 and N2O/O2 mixtures for use in ZnO:N synthesis by chemical vapor deposition", Journal of Applied Physics, vol. 96, No. 12 (Dec. 2004).

Ye et al., "High mobility amorphous zinc oxynitride semiconductor material for thin film transistors", Journal of Applied Physics, 106, 074512 (2009).

Chiang et al., "High mobility transparent thin-film transistors with amorphous zinc tin oxide channel layer", Appl. Phys. Lett., 86, 013503 (2005).

Fortunato et al., "Wide-bandgap high-mobility ZnO thin-film transistors produced at room temperature", Applied Physics Letters, vol. 85, No. 13, 2541-2543, (Sep. 2004).

Jackson et al., "High-performance flexible zinc tin oxide field-effect transistors", Applied Physics Letters, 87, 193503 (2005).

Freeman et al., "Chemical and Thin-Film Strategies for New Transparent Conducting Oxides", MRS Bulletin, Aug. 2000, p. 45-51.

Jin et al., "Optical properties of transparent and heat reflecting ZnO:Al films made by reactive sputtering", Appl. Phys. Lett. 51 (3), Jul. 20, 1987, p. 149-151.

Pei et al., "Optical and electrical properties of direct-current magnetron sputtered ZnO:Al films", Journal of Applied Physics, vol. 90, No. 7, Oct. 1, 2001, p. 3432-3436.

Gordon, "Criteria for Choosing Transparent Conductors", MRS Bulletin, Aug. 2000, p. 52-57.

Search Report and Written Opinion for PCT/US2009/049084 dated Jan. 25, 2010.

Lu et al., "p-type conduction in N—Al co-doped ZnO thin films", Applied Physics Letters, vol. 85, No. 15, Oct. 2004, p. 3134-3135.

Zhuge et al., "ZnO p-n homojunctions and ohmic contacts to Al—N-co-doped p-type ZnO", Applied Physics Letters, vol. 87, Aug. 2005.

dit Picard et al., "Detection of NH3 and H2S with thick film semiconductor sensors based on $Cd_{2-x}GeO_{4-x-3y}N_{2y}$ oxynitrides", Sensors and Actuators B, vol. 42, 1997, pp. 47-51.

Office Action for Chinese Patent Application No. 200880106291.5 dated Mar. 30, 2011.

International Search Report and Written Opinion for PCT/US2010/049239 dated May 4, 2011.

Office Action for Chinese Patent Application No. 200980125524.0 dated Jul. 4, 2012.

Office Action for Chinese Patent Application No. 200980125888.9 dated Jul. 27, 2012.

\* cited by examiner

TREATMENT OF GATE DIELECTRIC FOR MAKING HIGH PERFORMANCE METAL OXIDE AND METAL OXYNITRIDE THIN FILM TRANSISTORS

CROSS-REFERENCE TO RELATED APPLICATIONS

This application is a continuation of U.S. patent application Ser. No. 12/493,699 filed Jun. 29, 2009, which application claims benefit of U.S. Provisional Patent Application Ser. No. 61/077,831 filed Jul. 2, 2008, U.S. Provisional Patent Application Ser. No. 61/117,744 filed Nov. 25, 2008, U.S. Provisional Patent Application Ser. No. 61/117,747 filed Nov. 25, 2008, all of which are herein incorporated by reference.

GOVERNMENT RIGHTS IN THIS INVENTION

This invention was made with Government support under Agreement No. DAAD19-02-3-0001 awarded by ARL. The Government has certain rights in the Invention.

BACKGROUND OF THE INVENTION

1. Field of the Invention

Embodiments of the present invention generally relate to a method of fabricating thin film transistors (TFTs).

2. Description of the Related Art

Current interest in TFT arrays is particularly high because these devices may be used in liquid crystal active matrix displays (LCDs) of the kind often employed for computer and television flat panels. The LCDs may also contain light emitting diodes (LEDs) for back lighting. Further, organic light emitting diodes (OLEDs) have been used for active matrix displays, and these OLEDs require TFTs for addressing the activity of the displays.

TFTs made with amorphous silicon have become the key components of the flat panel display industry. Unfortunately amorphous silicon does have its limitations such as low mobility. The mobility required for OLEDs is at least 10 times higher than that achievable with amorphous silicon. In addition, OLED display is more sensitive to the $V_{th}$ shift since it is a current driven device. $V_{th}$ shift of amorphous silicon TFTs under either high current or high bias voltage is an issue to be addressed. Polysilicon, on the other hand, has a higher mobility than amorphous silicon. Polysilicon is crystalline, which leads to poor local non-uniformity. Due to the requirement of a complex annealing process to make the polysilicon film, it is more difficult or more costly to make large area displays using polysilicon as opposed to amorphous silicon. Due to the limitations of amorphous silicon, OLED advancement has been slow.

In recent years, transparent TFTs have been created in which zinc oxide has been used as the active channel layer. Zinc oxide is a compound semiconductor that can be grown as a crystalline material at relatively low deposition temperatures on various substrates such as glass and plastic.

Therefore, there is a need in the art for TFTs having amorphous active channels with high mobility.

SUMMARY OF THE INVENTION

The present invention generally includes TFTs and methods for their manufacture. The gate dielectric layer in the TFT may affect the threshold voltage of the TFT. By treating the gate dielectric layer prior to depositing the active channel material, the threshold voltage may be improved. One method of treating the gate dielectric involves exposing the gate dielectric layer to $N_2O$ gas. Another method of treating the gate dielectric involves exposing the gate dielectric layer to $N_2O$ plasma. Silicon oxide, while not practical as a gate dielectric for silicon based TFTs, may also improve the threshold voltage when used in metal oxide TFTs. By treating the gate dielectric and/or using silicon oxide, the sub threshold slope and threshold voltage of TFTs may be improved.

In one embodiment, a TFT fabrication method is disclosed. The method includes depositing a gate dielectric layer over a gate electrode and a substrate, exposing the gate dielectric layer to $N_2O$ plasma or other plasma for treatment, depositing a semiconductor layer over the gate dielectric layer, depositing a conductive layer over the semiconductor layer, and etching the conductive layer and the semiconductor layer to define source and drain electrodes and an active channel. The semiconductor layer includes oxygen and one or more elements selected from the group consisting of zinc, gallium, indium, cadmium, tin, and combinations thereof, or the semiconductor layer includes nitrogen, oxygen, and one or more elements selected from zinc, indium, tin, gallium, cadmium, and combinations thereof. The active channel is a portion of the semiconductor layer.

In another embodiment, a TFT fabrication method is disclosed. The method includes depositing a silicon nitride layer over a gate electrode and a substrate, depositing a silicon oxide layer over the silicon nitride layer, depositing a semiconductor layer over the silicon oxide layer, depositing a conductive layer over the semiconductor layer, and etching the conductive layer to define source and drain electrodes and an active channel. The semiconductor layer includes oxygen and one or more elements selected from the group consisting of zinc, gallium, indium, cadmium, tin, and combinations thereof, or the semiconductor layer includes nitrogen, oxygen, and one or more elements selected from zinc, indium, tin, gallium, cadmium, and combinations thereof. The active channel is a portion of the semiconductor layer.

In another embodiment, a TFT fabrication method is disclosed. The method includes depositing a silicon oxide layer over a gate electrode and a substrate, depositing a semiconductor layer over the silicon oxide layer, depositing a conductive layer over the semiconductor layer, and etching the conductive layer to define source and drain electrodes and an active channel. The semiconductor layer includes oxygen and one or more elements selected from the group consisting of zinc, gallium, indium, cadmium, tin, and combinations thereof, or the semiconductor layer includes nitrogen, oxygen, and one or more elements selected from zinc, indium, tin, gallium, cadmium, and combinations thereof. The active channel exposes a portion of the semiconductor layer.

In another embodiment, a TFT is disclosed. The TFT includes a silicon oxide layer disposed over a gate electrode and a substrate, a semiconductor layer disposed over the silicon oxide layer, and a source electrode and a drain electrode disposed over the semiconductor layer. The semiconductor layer includes oxygen and one or more elements selected from the group consisting of zinc, gallium, indium, cadmium, tin, and combinations thereof, or the semiconductor layer includes nitrogen, oxygen, and one or more elements selected from zinc, indium, tin, gallium, cadmium, and combinations thereof. The source and drain electrodes are spaced from each other to expose a portion of the semiconductor layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally includes TFTs and methods for their manufacture. The gate dielectric layer in the TFT may affect the threshold voltage of the TFT. By treating the gate dielectric layer prior to depositing the active channel material, the threshold voltage may be improved. One method of treating the gate dielectric involves exposing the gate dielectric layer to $N_2O$ gas at a temperature above 200 degrees Celsius. Another method of treating the gate dielectric involves exposing the gate dielectric layer to $N_2O$ plasma. Silicon oxide, while not practical as a gate dielectric for silicon based TFTs, may also improve the threshold voltage when used in metal oxide TFTs. By treating the gate dielectric and/or using silicon oxide, the threshold voltage of TFTs may be improved. Zinc oxide based semiconductors can be made as amorphous material though doping. Therefore, it will avoid a non-uniformity issue which is attributed to the grain structure. Amorphous semiconductors such as zinc oxide based semiconductor are easier to implement in current display manufacturing process using bottom gate TFT structures.

FIGS. 1A-1F are schematic cross sectional views of a TFT 100 according to one embodiment of the invention at various stages of fabrication. The TFT may comprise a substrate 102. In one embodiment, the substrate 102 may comprise glass. In another embodiment, the substrate 102 may comprise a polymer. In another embodiment, the substrate 102 may comprise plastic. In still another embodiment, the substrate 102 may comprise metal.

Over the substrate, a gate electrode 104 may be formed. The gate electrode 104 may comprise an electrically conductive layer that controls the movement of charge carriers within the TFT. The gate electrode 104 may comprise a metal such as aluminum, tungsten, chromium, tantalum, or combinations thereof. The gate electrode 104 may be formed using conventional deposition techniques including sputtering, lithography, and etching. The gate electrode 104 may be formed by blanket depositing a conductive layer over the substrate 102. The conductive layer may be deposited by sputtering. Thereafter, a photoresist layer may be deposited over the conductive layer. The photoresist layer may be patterned to form a mask. The gate electrode 104 may be formed by etching away the unmasked portions of the conductive layer to leave the gate electrode 104 on the substrate 102.

Over the gate electrode 104, a gate dielectric layer 106 may be deposited. The gate dielectric layer 106 affects the sub threshold swing or slope and the threshold voltage of the TFT. For silicon based TFTs (i.e., TFTs having a silicon based semiconductor layer such as amorphous silicon), the gate dielectric layer 106 cannot comprise silicon oxide because it may cause the TFT to have very positive $V_{th}$ and low mobility. However, for metal oxide TFTs, it has been discovered that silicon oxide may function as an effective gate dielectric layer 106. The oxygen in the silicon oxide may not effectively alter the metal oxide layer or interface and thus, the TFT may not fail. In one embodiment, the gate dielectric layer 106 may comprise silicon nitride. In another embodiment, the gate dielectric layer 106 may comprise silicon oxide. In another embodiment, the gate dielectric layer 106 may comprise silicon dioxide. In another embodiment, the gate dielectric layer 106 may comprise silicon oxynitride. In another embodiment, the gate dielectric layer 106 may comprise $Al_2O_3$. The gate dielectric layer 106 may be deposited by well known deposition techniques including plasma enhanced chemical vapor deposition (PECVD). In one embodiment, the gate dielectric layer 106 may be deposited by physical vapor deposition (PVD).

After the gate dielectric layer 106 has been deposited, the gate dielectric layer 106 may be treated. Various techniques for treating the gate dielectric layer 106 will be discussed in detail below. One of the techniques involves exposing the gate dielectric layer 106 to a plasma 108 to passivate the surface of the gate dielectric layer 106.

After treating the gate dielectric layer 106, the semiconductor layer 110 may be deposited thereover. The semiconductor layer 110 will be the material that comprises the active channel in the final TFT structure. The semiconductor layer 110 may comprise oxygen and one or more elements selected from the group consisting of zinc, gallium, cadmium, indium, tin, and combinations thereof, or nitrogen, oxygen, and one or more elements selected from zinc, indium, tin, gallium, cadmium, and combinations thereof. In one embodiment, the semiconductor layer 110 may comprise oxygen, nitrogen, and one or more elements having a filled s orbital and a filled d orbital. In another embodiment, the semiconductor layer 110 may comprise oxygen, nitrogen, and one or more elements having a filled f orbital. In another embodiment, the semiconductor layer 110 may comprise oxygen, nitrogen, and one or more divalent elements. In another embodiment, the semiconductor layer 110 may comprise oxygen, nitrogen, and one or more trivalent elements. In another embodiment, the semiconductor layer may comprise oxygen, nitrogen, and one or more tetravalent elements.

The semiconductor layer 110 may also comprise a dopant. Suitable dopants that may be used include Al, Sn, Ga, Ca, Si, Ti, Cu, Ge, In, Ni, Mn, Cr, V, Mg, $Si_xN_y$, $Al_xO_y$, and SiC. In one embodiment, the dopant comprises aluminum. In another embodiment, the dopant comprises tin.

Examples of semiconductor layer 110 include the following: $ZnO_xN_y$, $SnO_xN_y$, $InO_xN_y$, $CdO_xN_y$, $GaO_xN_y$, $ZnSnO_xN_y$, $ZnInO_xN_y$, $ZnCdO_xN_y$, $ZnGaO_xN_y$, $SnInO_xN_y$, $SnCdO_xN_y$, $SnGaO_xN_y$, $InCdO_xN_y$, $InGaO_xN_y$, $CdGaO_xN_y$, $ZnSnInO_xN_y$, $ZnSnCdO_xN_y$, $ZnSnGaO_xN_y$, $ZnInCdO_xN_y$, $ZnInGaO_xN_y$, $ZnCdGaO_xN_y$, $SnInCdO_xN_y$, $SnInGaO_xN_y$, $SnCdGaO_xN_y$, $InCdGaO_xN_y$, $ZnSnInCdO_xN_y$, $ZnSnInGaO_xN_y$, $ZnInCdGaO_xN_y$, and $SnInCdGaO_xN_y$. Examples of semiconductor layer 110 include the following doped materials: $ZnO_xN_y$:Al, $ZnO_xN_y$:Sn, $SnO_xN_y$:Al, $InO_xN_y$:Al, $InO_xN_y$:Sn, $CdO_xN_y$:Al, $CdO_xN_y$:Sn, $GaO_xN_y$:Al, $GaO_xN_y$:Sn, $ZnSnO_xN_y$:Al, $ZnInO_xN_y$:Al, $ZnInO_xN_y$:Sn, $ZnCdO_xN_y$:Al, $ZnCdO_xN_y$:Sn, $ZnGaO_xN_y$:Al, $ZnGaO_xN_y$:Sn, $SnInO_xN_y$:Al, $SnCdO_xN_y$:Al, $SnGaO_xN_y$:Al, $InCdO_xN_y$:Al, $InCdO_xN_y$:Sn, $InGaO_xN_y$:Al, $InGaO_xN_y$:Sn, $CdGaO_xN_y$:Al, $CdGaO_xN_y$:Sn, $ZnSnInO_xN_y$:Al, $ZnSnCdO_xN_y$:Al, $ZnSnGaO_xN_y$:Al, $ZnInCdO_xN_y$:Al, $ZnInCdO_xN_y$:Sn, $ZnInGaO_xN_y$:Al, $ZnInGaO_xN_y$:Sn, $ZnCdGaO_xN_y$:Al, $ZnCdGaO_xN_y$:Sn, $SnInCdO_xN_y$:Al, $SnInGaO_xN_y$:Al, $SnCdGaO_xN_y$:Al, $InCdGaO_xN_y$:Al, $InCdGaO_xN_y$:Sn, $ZnSnInCdO_xN_y$:Al, $ZnSnInGaO_xN_y$:Al, $ZnInCdGaO_xN_y$:Al, $ZnInCdGaO_xN_y$:Sn, and $SnInCdGaO_xN_y$:Al.

The semiconductor layer 110 may be deposited by sputtering. In one embodiment, the sputtering target comprises the metal such as zinc, gallium, tin, cadmium, indium, or combinations thereof. The sputtering target may additionally comprise a dopant. Oxygen containing gas and nitrogen containing gas are introduced into the chamber to deposit the semiconductor layer 110 by reactive sputtering. In one embodiment, the nitrogen containing gas comprises $N_2$. In another embodiment, the nitrogen containing gas comprises $N_2O$, $NH_3$, or combinations thereof. In one embodiment, the oxygen containing gas comprises $O_2$. In another embodiment, the oxygen containing gas comprises $N_2O$. The nitrogen of the nitrogen containing gas and the oxygen of the oxygen containing gas react with the metal from the sputtering target to form a semiconductor material comprising metal, oxygen, nitrogen, and optionally a dopant on the substrate. In one embodiment, the nitrogen containing gas and the oxygen containing gas are separate gases. In another embodiment, the nitrogen containing gas and the oxygen containing gas comprise the same gas. Additional additives such as $B_2H_6$, $CO_2$, CO, $CH_4$, and combinations thereof may also be provided to the chamber during the sputtering.

After the semiconductor layer 110 has been deposited, a conductive layer 112 may be deposited. In one embodiment, the conductive layer 112 may comprise a metal such as aluminum, tungsten, molybdenum, chromium, tantalum, and combinations thereof. The conductive layer 112 may be deposited by sputtering.

After the conductive layer 112 is deposited, the source electrode 114, the drain electrode 116, and the active channel 118 may be defined by etching away portions of the conductive layer 112. Portions of the semiconductor layer 110 may also be removed by etching. Although not shown, an etch stop layer may be deposited over the semiconductor layer 110 prior to depositing the conductive layer. The etch stop layer functions to protect the active channel 118 from undue plasma exposure during etching.

Figure 1A:
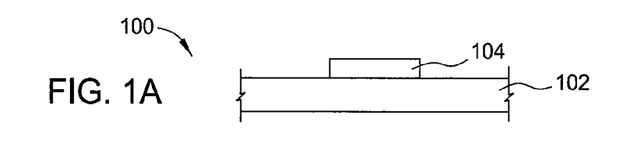
FIGS. 1A-1F are schematic cross sectional views of a TFT 100 according to one embodiment of the invention at various stages of fabrication.
Figure 1B:
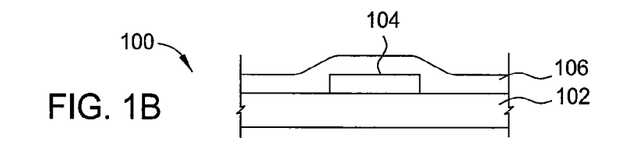
Figure 1C:
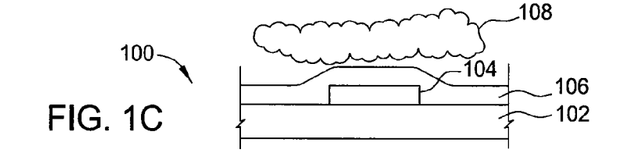
Figure 1D:
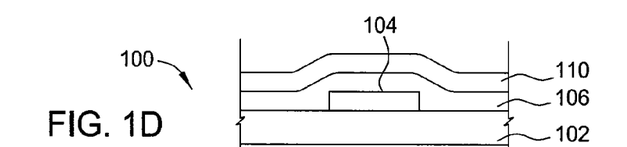
Figure 1E:
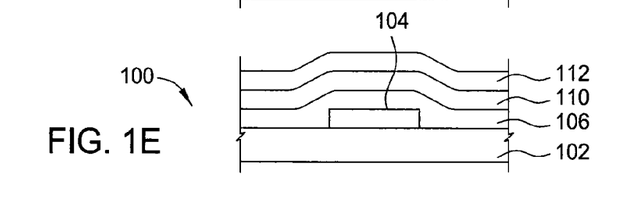
Figure 1F:
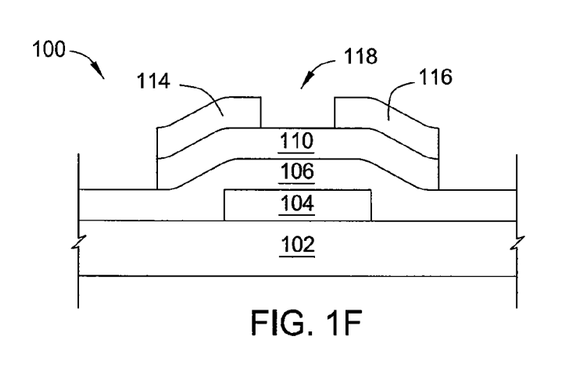
Figure 2:
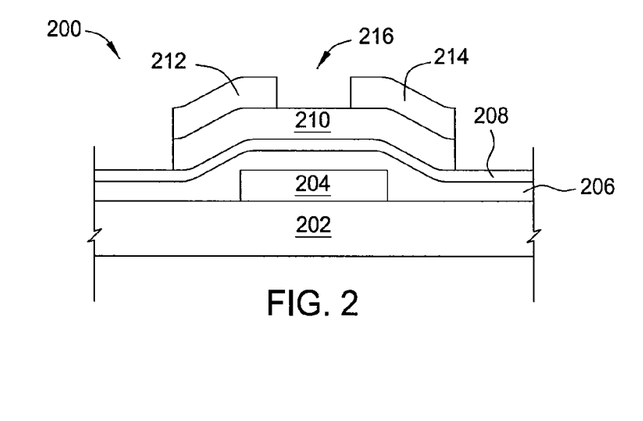
FIG. 2 is a schematic cross sectional view of a TFT 200 according to another embodiment of the invention.

FIG. 2 is a schematic cross sectional view of a TFT 200 according to another embodiment of the invention. The TFT 200 includes a gate electrode 204 disposed over a substrate 202. A source electrode 212, a drain electrode 214, an active channel 216, and a semiconductor layer 210 are also present. A multi layer gate dielectric is present. The gate dielectric may have a first gate dielectric layer 206 and a second gate dielectric layer 208. In one embodiment, the first gate dielectric layer 206 may comprise silicon nitride. In one embodiment, the second gate dielectric layer 208 may comprise silicon oxide. As noted above, silicon oxide, while not usable in silicon based TFTs, may be beneficial in metal oxide TFTs.

EXAMPLES

Table I shows a comparison of several TFTs that are substantially identical except for the treatment performed on the gate dielectric layer. For each Example, the gate dielectric layer is silicon nitride.

TABLE I

| Example | Treatment | $I_{on}$ | $I_{off}$ | Mo $(cm^2/V\text{-}s)$ | S (V/dec) | Vg (@1e-10 A & 10 Vds) | Vg (@1e-10-A & 0.1 Vds) |
|---|---|---|---|---|---|---|---|
| 1 | None, but no atmospheric exposure | 1.65E−04 | 4.00E−12 | 9.78 | 2 | −7 | −3 |
| 2 | SiO deposition over SiN | 1.04E−04 | 3.00E−12 | 7.65 | 1.48 | 0.5 | 2.5 |
| 3 | $N_2O$ plasma treatment | 1.34E−04 | 3.00E−12 | 7.84 | 1.42 | −3 | −1.5 |
| 4 | $PH_3$ plasma treatment | 2.00E−06 | 2.00E−12 | <1 | >4 | −5 | 0 |
| 5 | $NH_3$ plasma treatment | 1.00E−04 | 4.00E−12 | 6.28 | 2.34 | −10 | −5 |
| 6 | $H_2$ plasma treatment | 3.50E−05 | 7.00E−12 | 2.5 | 2.8 | −5 | 0 |
| 7 | Ar plasma treatment | 4.00E−05 | 3.00E−12 | 2.9 | 2.8 | −6 | −1 |
| 8 | None, but atmospheric exposure before active layer deposition | 9.00E−05 | 3.00E−12 | 6.2 | 1.84 | −5 | −2 |

TABLE I-continued

| Example | Treatment | $I_{on}$ | $I_{off}$ | Mo (cm$^2$/V-s) | S (V/dec) | Vg (@1e-10 A & 10 Vds) | Vg (@1e-10-A & 0.1 Vds) |
|---|---|---|---|---|---|---|---|
| 9 | N$_2$ plasma treatment | 2.00E−05 | 4.00E−12 | 2.9 | 2.8 | −5 | 2 |

Example 1

The TFT fabricated with a gate dielectric layer of silicon nitride was left untreated. After deposition of the gate dielectric layer, the semiconductor layer was deposited thereon without exposing the gate dielectric layer to atmosphere. The mobility of the TFT was 9.78 cm$^2$/V-s and the sub threshold slope was 2 V/dec.

Example 2

The TFT fabricated with a gate dielectric layer of silicon nitride with a layer of silicon oxide deposited thereon. The gate dielectric layer was not further treated. After deposition of the silicon oxide layer, the semiconductor layer was deposited thereon without exposing the gate dielectric layer or silicon oxide to atmosphere. The mobility of the TFT was 7.65 cm$^2$/V-s and the sub threshold slope was 1.48 V/dec.

Example 3

The TFT fabricated with a gate dielectric layer of silicon nitride and was exposed to a plasma of N$_2$O. The semiconductor layer was deposited thereon without exposing the gate dielectric layer to atmosphere. The mobility of the TFT was 7.84 cm$^2$/V-s and the sub threshold slope was 1.42 V/dec.

Example 4

The TFT fabricated with a gate dielectric layer of silicon nitride and was exposed to a plasma of PH$_3$. The semiconductor layer was deposited thereon without exposing the gate dielectric layer to atmosphere. The mobility of the TFT was less than 1 cm$^2$/V-s and the sub threshold slope was greater than 4 V/dec.

Example 5

The TFT fabricated with a gate dielectric layer of silicon nitride and was exposed to a plasma of NH$_3$. The semiconductor layer was deposited thereon without exposing the gate dielectric layer to atmosphere. The mobility of the TFT was 6.28 cm$^2$/V-s and the sub threshold slope was 2.34 V/dec.

Example 6

The TFT fabricated with a gate dielectric layer of silicon nitride and was exposed to a plasma of H$_2$. The semiconductor layer was deposited thereon without exposing the gate dielectric layer to atmosphere. The mobility of the TFT was 2.5 cm$^2$/V-s and the sub threshold slope was 2.8 V/dec.

Example 7

The TFT fabricated with a gate dielectric layer of silicon nitride and was exposed to a plasma of argon. The semiconductor layer was deposited thereon without exposing the gate dielectric layer to atmosphere. The mobility of the TFT was 2.9 cm$^2$/V-s and the sub threshold slope was 2.8 V/dec.

Example 8

The TFT fabricated with a gate dielectric layer of silicon nitride and was exposed to atmosphere. The semiconductor layer was then deposited over the silicon nitride layer. The mobility of the TFT was 6.2 cm$^2$/V-s and the sub threshold slope was 1.84 V/dec.

Example 9

The TFT fabricated with a gate dielectric layer of silicon nitride and was exposed to a plasma of N$_2$. The semiconductor layer was deposited thereon without exposing the gate dielectric layer to atmosphere. The mobility of the TFT was 2.9 cm$^2$/V-s and the sub threshold slope was 2.8 V/dec.

As shown by the above examples, the treatment of the gate dielectric layer may affect the sub threshold slope and the mobility. The additional silicon oxide layer over the silicon nitride layer produced a TFT having good mobility and a very good sub threshold slope. Additionally, the N$_2$O plasma treatment produced a TFT having good mobility and very good sub threshold slope. While the mobility for the silicon oxide TFT and the N$_2$O plasma was both lower than the TFT left untreated, the sub threshold slope was significantly better. Conversely, treatment with an argon plasma, a H$_2$ plasma, an NH$_3$ plasma, or a N$_2$ plasma makes the sub threshold slope much worse. Thus, the type of treatment performed on the gate dielectric layer affects the performance of the TFT. It is believed that the oxygen in the N$_2$O plasma reduces the silicon nitride or breaks the silicon to nitrogen bonds and passivates the surface.

Figure 3:
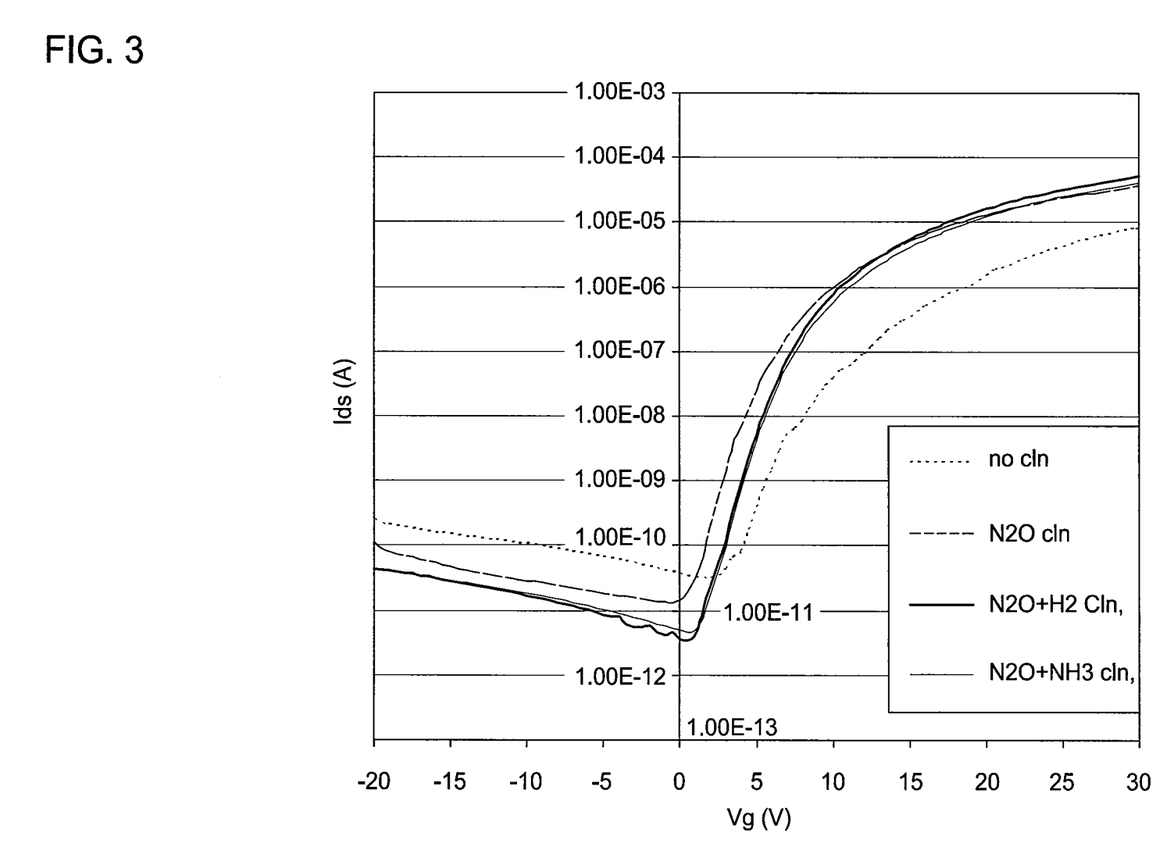
FIG. 3 is a graph showing the effects of exposing the gate dielectric layer to a plasma treatment prior to deposition of the active layer material according to one embodiment of the invention.

FIG. 3 is a graph showing the effects of exposing the gate dielectric layer to a plasma treatment prior to deposition of the active layer material according to one embodiment of the invention. Four separate results are shown in FIG. 3, no treatment, N$_2$O plasma exposure, N$_2$O plasma followed by H$_2$ plasma exposure, and N$_2$O plasma followed by NH$_3$ plasma exposure. While a treatment of the gate dielectric layer with either H$_2$ plasma or NH$_3$ plasma alone do not provide good results as shown in the above examples, exposing the gate dielectric layer to either H$_2$ plasma or NH$_3$ plasma after N$_2$O plasma can produce a sub threshold slope comparable to N$_2$O plasma treatment alone.

Additional gate dielectric treatments have also been explored. For example, the gate dielectric layer may be exposed to N$_2$O gas without a plasma and then to N$_2$O plasma.

Figure 4A:
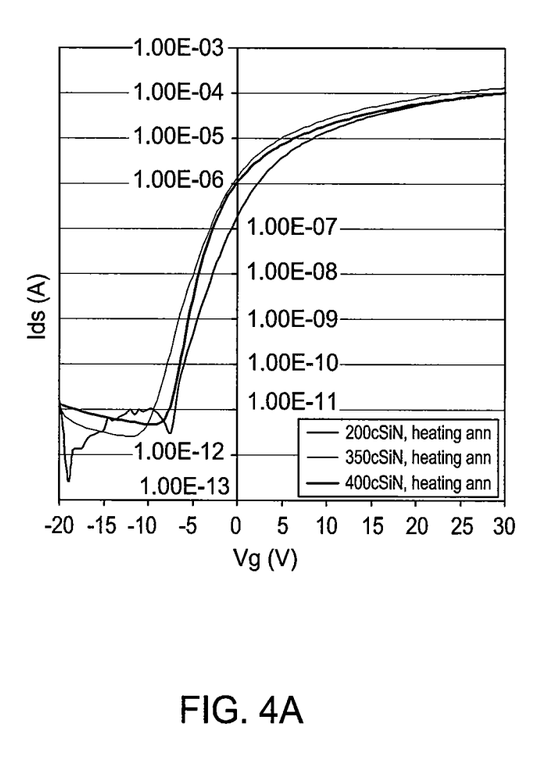
FIG. 4A is a graph showing the effect of the deposition temperature of the gate dielectric layer according to one embodiment of the invention.

FIG. 4A is a graph showing the effect of the deposition temperature of the gate dielectric layer according to one embodiment of the invention. As shown in FIG. 4A, a silicon nitride gate dielectric layer deposited at 200 degrees Celsius has a more positive V$_{th}$ as compared to a silicon nitride gate dielectric layer deposited at 350 degrees Celsius or a silicon oxide gate dielectric layer deposited at 400 degrees Celsius that is annealed. However, the silicon oxide TFT has a smaller sub threshold slope.

Figure 4B:
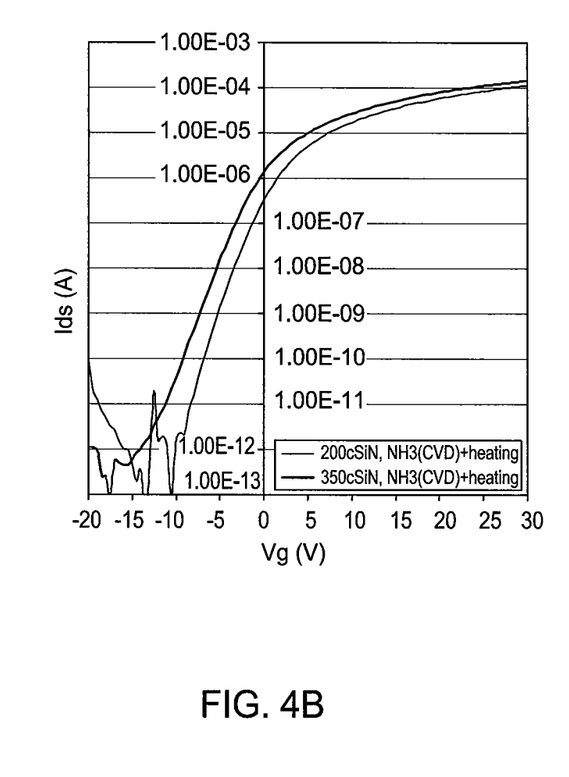
FIG. 4B is a graph showing the effect of plasma treating with $NH_3$ and annealing the gate dielectric layer prior to depositing the active layer material according to one embodiment of the invention.

FIG. 4B is a graph showing the effect of exposing the gate dielectric layer to $NH_3$ according to one embodiment of the invention. As shown in FIG. 4B, a silicon nitride gate dielectric layer deposited at 200 degrees Celsius and exposed to $NH_3$ has a more positive $V_{th}$ and a lower sub threshold slope as compared to a silicon nitride gate dielectric layer deposited at 350 degrees Celsius and exposed to $NH_3$.

Figure 5:
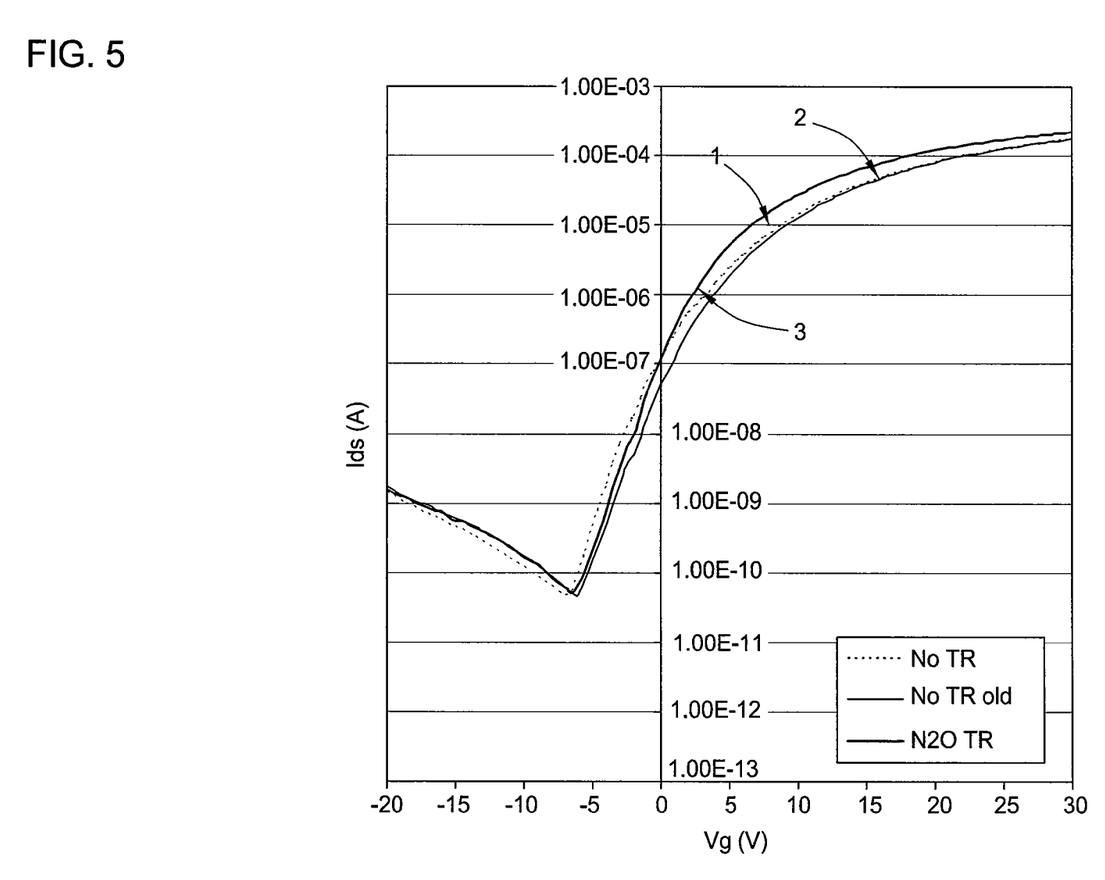
FIG. 5 is a graph showing the effect of $N_2O$ plasma treatment on the gate dielectric layer prior to depositing the active layer material according to one embodiment of the invention.

FIG. 5 is a graph showing the effect of $N_2O$ plasma treatment on the gate dielectric layer prior to depositing the active layer material according to one embodiment of the invention. Table II shows the mobility and sub threshold slope values for the three TFTs shown in FIG. 5.

TABLE II

| TFT | Description | Ion | Ioff | Mo (cm²/V-s) | S | Vg (@ 1e-1o A & 10 Vds) |
|---|---|---|---|---|---|---|
| 1 | Without treatment | 2.00E−04 | 4.50E−11 | 10 | 1.74 | −6 |
| 2 | $N_2O$ treatment | 2.50E−04 | 5.00E−11 | 11.3 | 1.51 | −5 |
| 3 | Without treatment | 2.00E−04 | 5.00E−11 | 10 | 1.74 | −5 |

For the TFTs of FIG. 5, each had the silicon nitride gate dielectric layer deposited at 200 degrees Celsius. TFT 2 was fabricated by treating the gate dielectric layer with $N_2O$ plasma prior to depositing the semiconductor layer. TFT 2 had a higher mobility and a lower sub threshold slope as compared to TFTs 1 and 3 which were not treated with $N_2O$ plasma prior to depositing the semiconductor layer. The difference between the non-plasma treated TFTs is that the TFT 3 was aged 4 months.

Figure 6A:
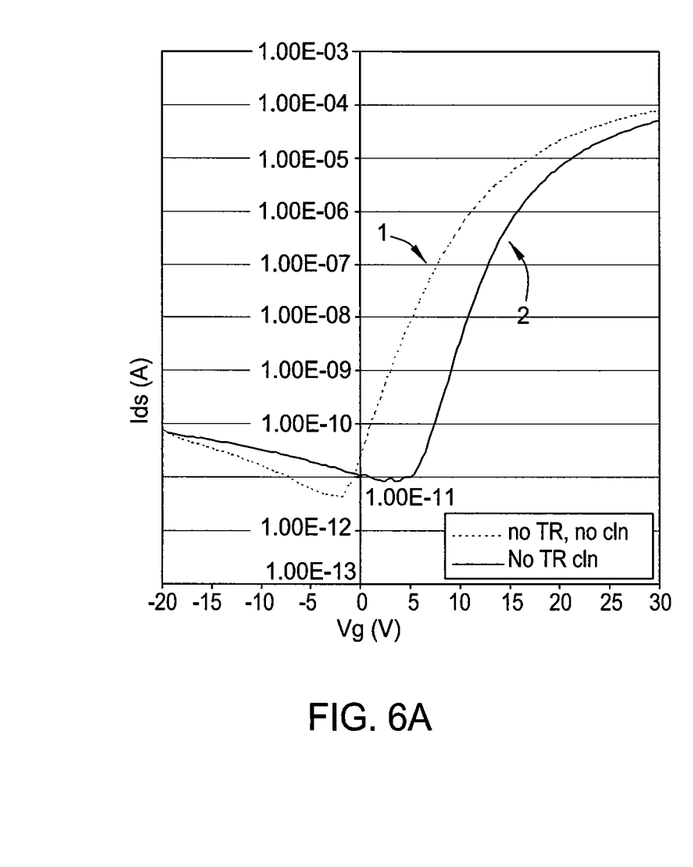
FIGS. 6A and 6B are graphs showing the effect of $N_2O$ exposure and $N_2O$ plasma treatment of the gate dielectric layer prior to depositing the active layer material according to one embodiment of the invention.
Figure 6B:
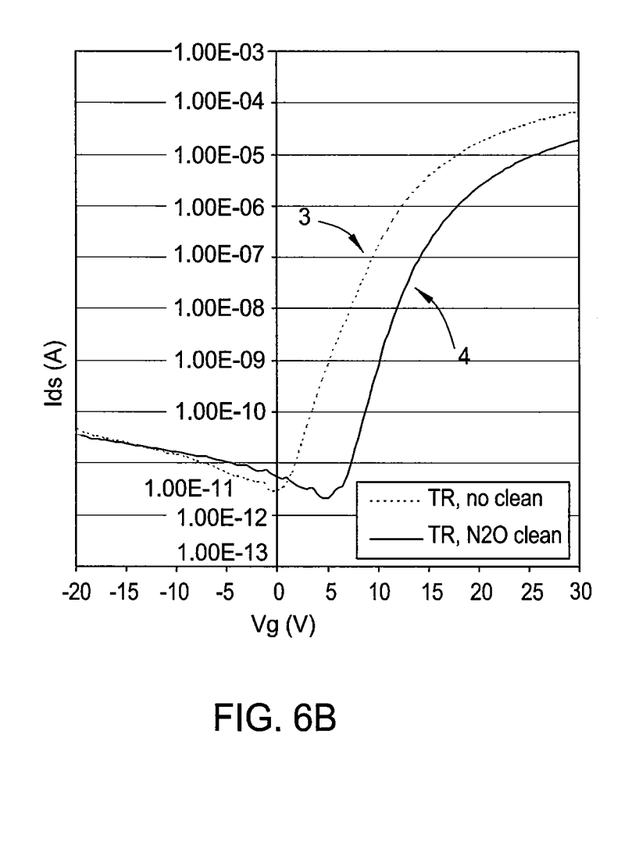

FIGS. 6A and 6B are graphs showing the effect of $N_2O$ exposure and $N_2O$ plasma treatment of the gate dielectric layer prior to depositing the active layer material according to one embodiment of the invention. Table III shows the sub threshold slope and saturation mobility for four substrates shown in FIGS. 6A and 6B.

TABLE III

| TFT | Description | $I_{on}$ | $I_{off}$ | Sat Mo | S | Vg (@ 1e−10 A & 10 Vds) |
|---|---|---|---|---|---|---|
| 1 | No treatment, no clean | 8.03E−05 | 4.15E−12 | 8 | 1.79 | 1.14 |
| 2 | No treatment, $N_2O$ clean | 5.13E−05 | 8.35E−12 | 8.14 | 1.61 | 7.43 |
| 3 | $N_2O$ treatment, no clean | 6.58E−05 | 3.15E−12 | 7.05 | 1.61 | 3.43 |
| 4 | $N_2O$ treatment and clean | 1.93E−05 | 2.00E−12 | 3.2 | 1.39 | 8.71 |

The $N_2O$ treatment comprised exposing the deposited gate dielectric layer to $N_2O$ gas. The $N_2O$ clean comprised exposing the deposited gate dielectric layer to $N_2O$ plasma. The $N_2O$ clean has a stronger effect then the $N_2O$ treatment. However, the $N_2O$ does lower the $I_{off}$. The $N_2O$ clean and the $N_2O$ both lowered the sub threshold slope. However, when both a $N_2O$ clean and a $N_2O$ treatment occurred, the sub threshold slope was lowered even further. The saturation mobility also decreased significantly when both a $N_2O$ clean and a $N_2O$ treatment occurred. As shown in Table III, the Vg at 10 Vds is much higher when a $N_2O$ clean was performed as compared to no treatment or a $N_2O$ treatment.

Figure 7A:
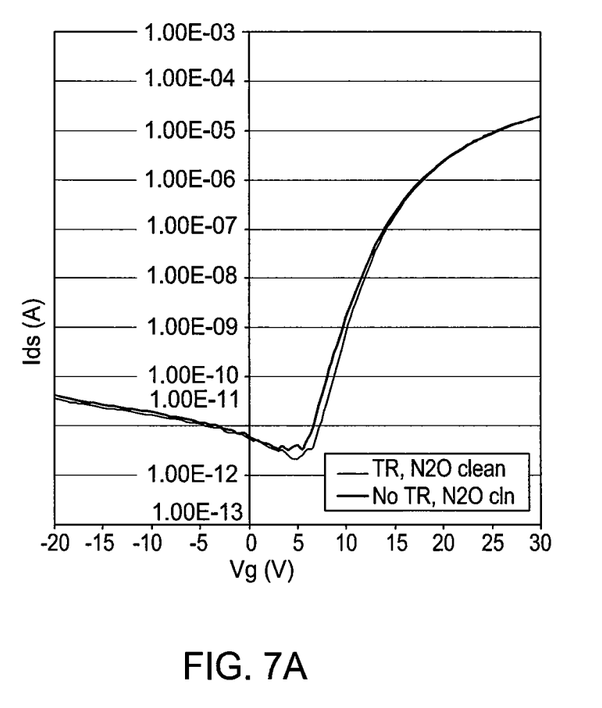
FIGS. 7A and 7B are graphs showing the effect of the temperature of $N_2O$ exposure and the temperature of $N_2O$ plasma treatment of the gate dielectric layer prior to depositing the active layer material according to one embodiment of the invention.
Figure 7B:
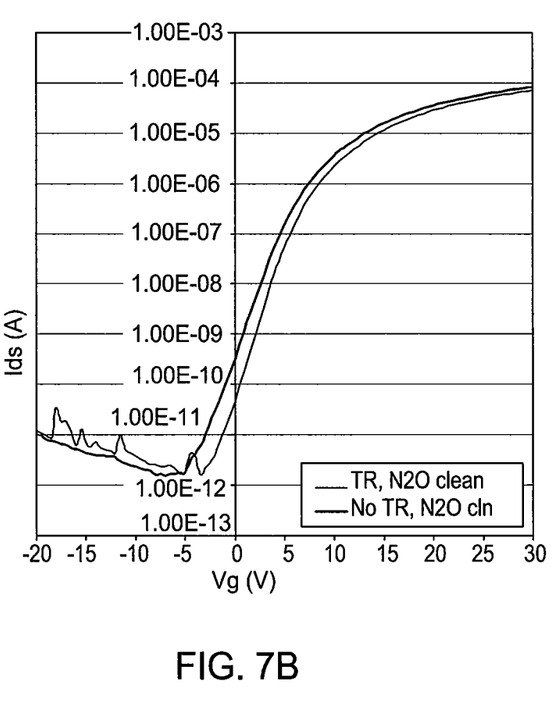

FIGS. 7A and 7B are graphs showing the effect of the temperature of $N_2O$ exposure and the temperature of $N_2O$ plasma treatment of the gate dielectric layer prior to depositing the active layer material according to one embodiment of the invention. FIG. 7A was performed at 200 degrees Celsius and shows the results for an exposure to $N_2O$ gas and/or $N_2O$ plasma. FIG. 7B was performed at 300 degrees Celsius and shows the results for exposure to $N_2O$ gas and/or $N_2O$ plasma. In the situation where the gate dielectric was exposed to $N_2O$ gas, the $N_2O$ plasma treatment occurred first. The $N_2O$ gas exposure had little effect on the sub threshold slope.

While $N_2O$ has been exemplified as the exposure gas for plasma treatment and gas exposure, oxygen containing gas may be equally as effective. For example, it is contemplated that $O_2$, $CO_2$, and combinations thereof may be utilized as the exposure gas or the plasma gas. The temperature of the substrate may be maintained at a temperature form about room temperature to about 400 degrees Celsius. In one embodiment, room temperature may be about 25 degrees Celsius. The treatment step may occur in multiple steps and may utilize different processing gas for each step. For example, an initial treatment with an oxygen containing gas such as $N_2O$, $O_2$, or $CO_2$ may be used in the first treatment step. Then, a second treatment step may occur with a different gas such as $H_2$, $PH_3$, and combinations thereof. In one embodiment, both steps may comprise a plasma exposure. In another embodiment, the first step may comprise plasma treatment and the second step may comprise gas exposure without plasma. In another embodiment, more than two steps may occur.

By utilizing a silicon oxide layer over the gate dielectric layer or by treatment the gate dielectric layer with an oxygen containing gas, the sub threshold slope and/or the mobility may be improved for a TFT.

While the foregoing is directed to embodiments of the present invention, other and further embodiments of the invention may be devised without departing from the basic scope thereof, and the scope thereof is determined by the claims that follow.

The invention claimed is:

1. A thin film transistor fabrication method, comprising:
    depositing a gate dielectric layer over a gate electrode and a substrate;
    exposing the gate dielectric layer to an oxygen containing plasma;
    sputter depositing a semiconductor layer over the gate dielectric layer, the semiconductor layer comprising oxygen, zinc, gallium, and indium;
    depositing a conductive layer over the semiconductor layer; and
    etching the conductive layer to define source and drain electrodes and an active channel, the active channel exposing a portion of the semiconductor layer.

2. The method of claim 1, wherein the gate dielectric layer comprises silicon nitride, silicon oxide, or a bi-layer of silicon nitride and silicon oxide.

3. The method of claim 1, further comprising exposing the gate dielectric layer to a hydrogen plasma after exposing the gate dielectric to the oxygen containing plasma.

4. The method of claim 1, wherein the semiconductor layer further comprises nitrogen.

5. The method of claim 1, wherein the exposing is performed in-situ with the gate dielectric layer deposition.

6. The method of claim 1, wherein the oxygen containing plasma comprises $N_2O$.

7. A thin film transistor fabrication method, comprising:
depositing a silicon nitride layer over a gate electrode and a substrate;
depositing a silicon oxide layer over the silicon nitride layer;
sputter depositing a semiconductor layer over the silicon oxide layer, the semiconductor layer comprising oxygen, zinc, gallium and indium;
depositing a conductive layer over the semiconductor layer; and
etching the conductive layer to define source and drain electrodes and an active channel, the active channel exposing a portion of the semiconductor layer.

8. The method of claim 7, further comprising exposing the silicon oxide layer to $N_2O$ plasma.

9. The method of claim 8, further comprising exposing the silicon oxide layer to hydrogen plasma after exposing the silicon oxide layer to $N_2O$ plasma.

10. The method of claim 8, wherein the exposing occurs in situ with the silicon oxide layer deposition.

11. The method of claim 8, further comprising exposing the silicon oxide layer to oxygen plasma after the exposing to $N_2O$ plasma.

12. The method of claim 7, wherein the semiconductor layer further comprises nitrogen.

13. A thin film transistor fabrication method, comprising:
depositing a silicon oxide layer over a gate electrode and a substrate;
sputter depositing a semiconductor layer over the silicon oxide layer, the semiconductor layer comprising oxygen, zinc, gallium and indium;
depositing a conductive layer over the semiconductor layer; and
etching the conductive layer to define source and drain electrodes and an active channel, the active channel exposing a portion of the semiconductor layer.

14. The method of claim 13, further comprising exposing the silicon oxide layer to $N_2O$ plasma.

15. The method of claim 14, further comprising exposing the silicon oxide layer to hydrogen plasma after exposing the silicon oxide layer to $N_2O$ plasma.

16. The method of claim 14, wherein the exposing occurs in situ with the silicon oxide layer deposition.

17. The method of claim 14, further comprising exposing the silicon oxide layer to oxygen plasma after the exposing to $N_2O$ plasma.

18. The method of claim 13, wherein the semiconductor layer further comprises nitrogen.

19. A thin film transistor, comprising:
a silicon oxide layer disposed over a gate electrode and a substrate;
a semiconductor layer disposed over the silicon oxide layer, the semiconductor layer comprising oxygen, zinc, gallium and indium; and
a source electrode and a drain electrode disposed over the semiconductor layer, the source and drain electrodes spaced from each other to expose a portion of the semiconductor layer.

20. The transistor of claim 19, further comprising a silicon nitride layer disposed on the gate electrode and substrate, and below the silicon oxide layer.

* * * * *